United States Patent
Chuang

(10) Patent No.: US 9,305,915 B2
(45) Date of Patent: *Apr. 5, 2016

(54) ESD PROTECTION CIRCUIT

(71) Applicant: MediaTek Inc., Hsin-Chu (TW)

(72) Inventor: Chien-Hui Chuang, New Taipei (TW)

(73) Assignee: MEDIATEK INC., Hsin-Chu (TW)

( * ) Notice: Subject to any disclaimer, the term of this patent is extended or adjusted under 35 U.S.C. 154(b) by 0 days.

This patent is subject to a terminal disclaimer.

(21) Appl. No.: 14/635,255

(22) Filed: Mar. 2, 2015

(65) Prior Publication Data

US 2015/0179630 A1   Jun. 25, 2015

Related U.S. Application Data

(63) Continuation of application No. 13/742,854, filed on Jan. 16, 2013, now Pat. No. 9,001,479.

(60) Provisional application No. 61/595,933, filed on Feb. 7, 2012.

(51) Int. Cl.
  *H02H 9/00* (2006.01)
  *H01L 27/02* (2006.01)
  *H03K 19/003* (2006.01)

(52) U.S. Cl.
  CPC ........ *H01L 27/0266* (2013.01); *H01L 27/0277* (2013.01); *H03K 19/00315* (2013.01)

(58) Field of Classification Search
  CPC .................................................. H01L 27/0266
  USPC .......................................................... 361/56
  See application file for complete search history.

(56) References Cited

U.S. PATENT DOCUMENTS

| | | | |
|---|---|---|---|
| 6,690,555 B1 | 2/2004 | Pasqualini | |
| 7,289,307 B2 | 10/2007 | Ker et al. | |
| 8,767,359 B2 | 7/2014 | Zhu et al. | |
| 8,879,220 B2 * | 11/2014 | Lin | H02H 9/046 361/56 |
| 8,908,341 B2 * | 12/2014 | Prabhu | H02H 9/046 361/111 |
| 2006/0152868 A1 | 7/2006 | Ker et al. | |

FOREIGN PATENT DOCUMENTS

| | | |
|---|---|---|
| CN | 1447427 | 10/2003 |
| CN | 101783343 | 7/2010 |

* cited by examiner

*Primary Examiner* — Stephen W Jackson
(74) *Attorney, Agent, or Firm* — McClure, Qualey & Rodack, LLP

(57) ABSTRACT

An electrostatic discharge (ESD) protection circuit is provided. The ESD protection circuit includes a first NMOS transistor coupled to a power line, a second NMOS transistor coupled between the first transistor and a ground, a detection unit, providing a detection signal when an ESD event occurs at the power line, and a trigger unit, turning on the second NMOS transistor and the first NMOS transistor in sequence in response to the detection signal, such that a discharge path is formed from the power line to the ground via the first and second NMOS transistors. The trigger unit includes a first PMOS transistor coupled between the power line and a gate of the second NMOS transistor, a fourth resistor, and a second PMOS transistor, having a gate coupled to the cathode of the diode for receiving the detection signal.

12 Claims, 6 Drawing Sheets

US 9,305,915 B2

ESD PROTECTION CIRCUIT

CROSS REFERENCE TO RELATED APPLICATIONS

This application is a continuation of pending U.S. application Ser. No. 13/742,854, filed on Jan. 16, 2013, claims priority of U.S. Provisional Application No. 61/595,933, filed on Feb. 7, 2012, the entireties of which are incorporated by reference herein.

BACKGROUND OF THE INVENTION

1. Field of the Invention

The invention relates to an electrostatic discharge (ESD) protection circuit, and more particularly to an ESD protection circuit for a low-voltage process.

2. Description of the Related Art

Electrostatic discharge phenomena will cause damage to semiconductor devices and affect the normal functioning of integrated circuits (IC). Thus, it is a necessary goal for IC designers, during the design stage, to enhance ESD protection of an IC to increase ESD sensitivity.

Recently, more and more ICs can operate with lower operating voltages, such as operating voltages of typical logic circuits, i.e. 1.8V etc., due to the rapid advancement of low-voltage manufacturing technology. However, for certain products which have particular application requirements, certain pins for an IC require operating at higher voltages, i.e. 3V, 3.3V and so on.

For ICs, malfunctions will occur in low-voltage devices when a higher voltage is applied to the low-voltage devices. In this situation, the functions of the low-voltage device will be false since the low-voltage ESD protection circuit is unable to protect pins operating at higher voltages.

BRIEF SUMMARY OF THE INVENTION

Electrostatic discharge (ESD) protection circuits are provided. An embodiment of an ESD protection circuit is provided. The ESD protection circuit comprises: a first NMOS transistor coupled to a power line; a second NMOS transistor coupled between the first transistor and a ground; a detection unit, providing a detection signal when an ESD event occurs at the power line; and a trigger unit, turning on the second NMOS transistor and the first NMOS transistor in sequence in response to the detection signal, such that a discharge path is formed from the power line to the ground via the first and second NMOS transistors.

Furthermore, another embodiment of an ESD protection circuit is provided. The ESD protection circuit comprises: a first diode, having an anode coupled to a pad and a cathode coupled to a power line; a first NMOS transistor coupled to the pad; a second NMOS transistor coupled between the first transistor and a ground; a detection unit coupled between the power line and the ground, providing a detection signal when an ESD event occurs at the pad; a trigger unit coupled between the power line and the ground, turning on the second NMOS transistor and the first NMOS transistor in sequence in response to the detection signal, such that a first discharge path is formed from the pad to the ground through the first and second NMOS transistors.

A detailed description is given in the following embodiments with reference to the accompanying drawings.

BRIEF DESCRIPTION OF DRAWINGS

The invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1:
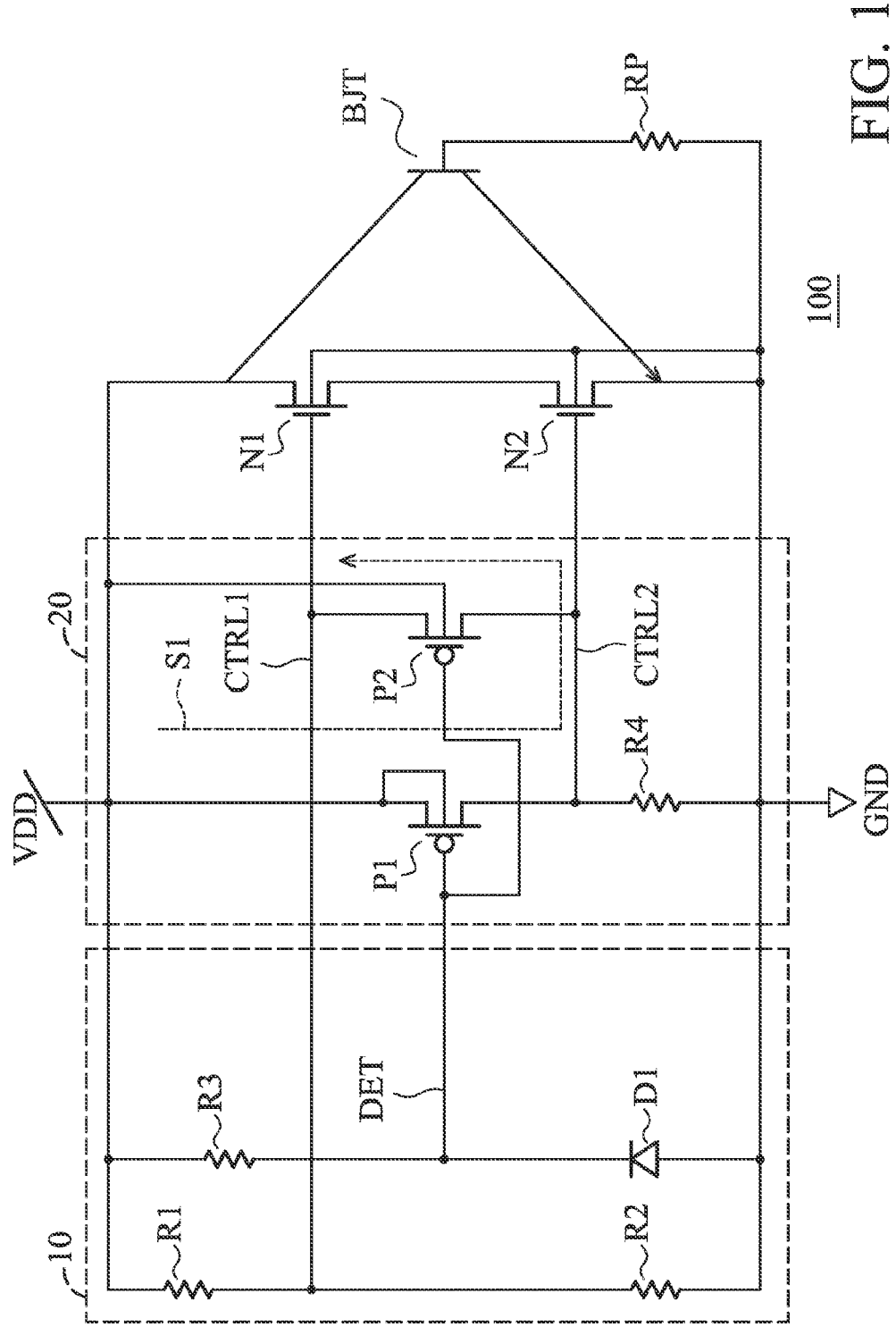
FIG. 1 shows an electrostatic discharge (ESD) protection circuit according to an embodiment of the invention.

FIG. 1 shows an electrostatic discharge (ESD) protection circuit 100 according to an embodiment of the invention, wherein the ESD protection circuit 100 is implemented in an integrated circuit (IC). The ESD protection circuit 100 comprises the NMOS transistors N1 and N2, a detection unit 10 and a trigger unit 20. The detection unit 10 comprises the resistors R1, R2 and R3 and a diode D1. The resistor R1 is coupled between a power line VDD and a gate of the NMOS transistor N1. The resistor R2 is coupled between a ground GND and the gate of the NMOS transistor N1. The resistor R3 is coupled between the power line VDD and the diode D1, wherein an anode of the diode D1 is coupled to the resistor R3 and a cathode of the diode D1 is coupled to the ground GND. Furthermore, the diode D1 can be any device type (p-n diode, MOS-connected diode and so on). The trigger unit 20 comprises the PMOS transistors P1 and P2 and a resistor R4. The PMOS transistor P1 is coupled between the power line VDD and a gate of the NMOS transistor N2. The PMOS transistor P2 is coupled between the gates of the NMOS transistors N1 and N2. The gates of the PMOS transistor P1 and P2 are coupled to the cathode of the diode D1 for receiving a detection signal DET, and the bulks of the PMOS transistors P1 and P2 are coupled to the power line VDD. In the embodiment, the NMOS transistors N1 and N2 are stacked NMOS transistors for reliability, wherein the NMOS transistor N1 is coupled between the power line VDD and the NMOS transistor N2 and the NMOS transistor N2 is coupled between the NMOS transistor N1 and the ground GND. The gate of the NMOS transistor N1 is controlled by a control signal CTRL1, and the gate of the NMOS transistor N2 is controlled by a control signal CTRL2, wherein the bulks of the NMOS transistors N1 and N2 are coupled to the ground GND.

In FIG. 1, the NMOS transistor N1 and N2 and the PMOS transistors P1 and P2 are low-voltage devices (e.g. 1.8V), and a higher fixed voltage (e.g. 3.3V) is applied to the power line VDD via a power pad of the IC. In normal mode, the control signal CTRL1 is determined according to a voltage division between the resistors R1 and R2, e.g. if R1=R2, CTRL1=VDD/2. Thus, the NMOS transistor N1 is turned on. Furthermore, the detection signal DET is determined according to a voltage of the power line VDD due to the diode D1 being off. Therefore, the PMOS transistors P1 and P2 are turned off, and then the control signal CTRL2 is pulled down to the ground GND via the resistor R4. Thus, the NMOS transistor N2 is turned off. When an ESD event occurs at the power line VDD, the detection unit 10 provides the detection signal DET in response to the ESD event to turn on the PMOS transistors P1 and P2. Next, a portion of ESD energy from the power line VDD passes through the PMOS transistor P1 to turn on the NMOS transistor N2, and then passed through the PMOS transistor P2 to turn on the NMOS transistor N1, as shown in label S1. Therefore, a discharge path is formed from the power line VDD to the ground GND via the NMOS transistors N1 and N2 in an ESD mode, such that the electrical devices of the IC coupled to the power line VDD will be prevented from ESD damage. Furthermore, a parasitic bipolar transistor BJT and a parasitic resistor RP may further provide an additional discharge path for the ESD protection circuit 100.

Figure 2:
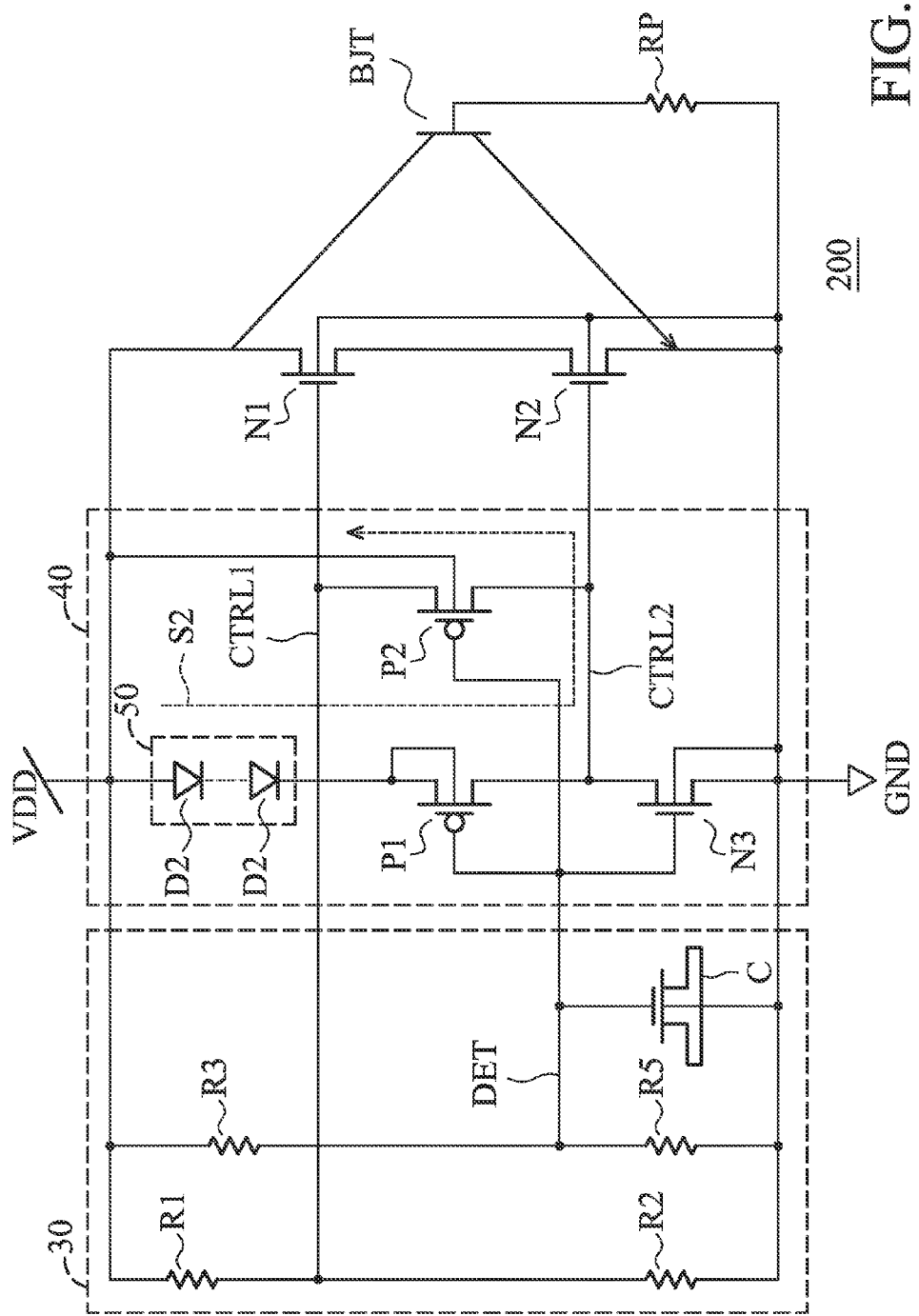
FIG. 2 shows an ESD protection circuit according to another embodiment of the invention.

FIG. 2 shows an ESD protection circuit 200 according to another embodiment of the invention, wherein the ESD protection circuit 200 is implemented in an IC. The ESD protection circuit 200 comprises the NMOS transistors N1 and N2, a detection unit 30 and a trigger unit 40. The detection unit 30 comprises the resistors R1, R2, R3 and R5 and a capacitor C, wherein the capacitor C is formed by an NMOS transistor. The resistor R1 is coupled between the power line VDD and a gate of the NMOS transistor N1. The resistor R2 is coupled between the ground GND and the gate of the NMOS transistor N1. The resistor R3 is coupled between the power line VDD and the resistor R5. The resistor R5 is coupled between the resistor R3 and the ground GND. The capacitor C is coupled to the resistor R5 in parallel. The trigger unit 40 comprises the PMOS transistors P1 and P2, an NMOS transistor N3 and a diode chain 50. The diode chain 50 is coupled between the power line VDD and the PMOS transistor P1, which comprises a plurality of diodes D2. Each diode D2 is coupled in a forward conduction direction from the power line VDD to the PMOS transistor P1. Furthermore, each diode D2 can be any device type (p-n diode, MOS-connected diode and so on). The amount of the diodes D2 is determined according to actual applications. For example, a forward bias voltage of the diode chain 50 plus a threshold voltage of the PMOS transistor P1 equals a voltage of the detection signal DET. In one embodiment, the diode chain 50 may only comprise a single diode D2. The PMOS transistor P1 is coupled between the diode chain 50 and a gate of the NMOS transistor N2. The PMOS transistor P2 is coupled between the gates of the NMOS transistors N1 and N2. The gates of the PMOS transistor P1 and P2 are coupled to the capacitor C for receiving a detection signal DET, and the bulks of the PMOS transistors P1 and P2 are coupled to the diode chain 50 and the power line VDD, respectively. The NMOS transistor N3 is coupled between the PMOS transistor P1 and the ground GND, wherein a gate of the NMOS transistor N3 is coupled to the capacitor C for receiving the detection signal DET. Similarly, the NMOS transistors N1 and N2 are stacked NMOS transistors for reliability, wherein the NMOS transistor N1 is coupled between the power line VDD and the NMOS transistor N2 and the NMOS transistor N2 is coupled between the NMOS transistor N1 and the ground GND. The gate of the NMOS transistor N1 is controlled by a control signal CTRL1, and the gate of the NMOS transistor N2 is controlled by a control signal CTRL2, wherein the bulks of the NMOS transistors N1 and N2 are coupled to the ground GND.

In FIG. 2, the NMOS transistor N1, N2 and N3 and the PMOS transistors P1 and P2 are low-voltage devices (e.g. 1.8V), and a higher fixed voltage (e.g. 3.3V) is applied to the power line VDD via a power pad of the IC. In normal mode, the control signal CTRL1 is determined according to a voltage division between the resistors R1 and R2, e.g. if R1=R2, CTRL1=VDD/2. Thus, the NMOS transistor N1 is turned on. Furthermore, the detection signal DET is determined according to a voltage division between the resistors R3 and R5, e.g. if R3=R5, DET=VDD/2. Therefore, the PMOS transistors P1 and P2 are turned off and the NMOS transistor N3 is turned on, and then the control signal CTRL2 is pulled down to the ground GND via the NMOS transistor N3. Thus, the NMOS transistor N2 is turned off. When an ESD event occurs at the power line VDD, the detection unit 30 provides the detection signal DET in response to the ESD event, to turn on the PMOS transistors P1 and P2 and to turn off the NMOS transistor N3. Next, a portion of ESD energy from the power line VDD passes through the diode chain 50 and the PMOS transistor P1, to turn on the NMOS transistor N2, and then passes through the PMOS transistor P2 to turn on the NMOS transistor N1, as shown in label S2. Therefore, a discharge path is formed from the power line VDD to the ground GND via the NMOS transistors N1 and N2 in ESD mode, such that the electrical devices of the IC coupled to the power line VDD will be prevented from ESD damage. Furthermore, a parasitic bipolar transistor BJT and a parasitic resistor RP may provide an additional discharge path for the ESD protection circuit 200.

Figure 3:
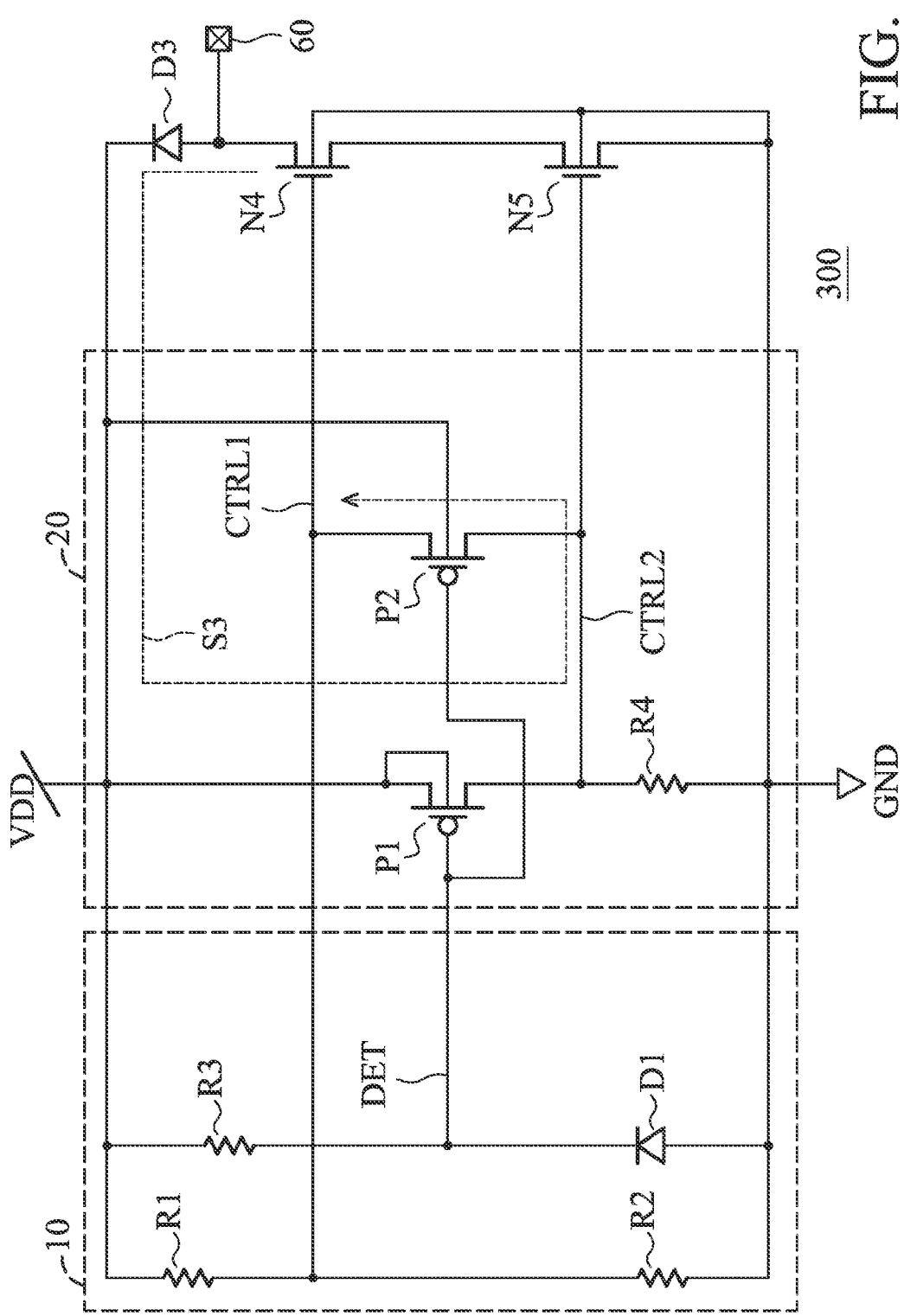
FIG. 3 shows an ESD protection circuit according to another embodiment of the invention.

FIG. 3 shows an ESD protection circuit 300 according to another embodiment of the invention, wherein the ESD protection circuit 300 is implemented in an IC. Compared to the ESD protection circuit 100 of FIG. 1, the ESD protection circuit 300 is used to provide ESD protection for an input/output (I/O) pad 60 of the IC. The ESD protection circuit 300 comprises a diode D3, the NMOS transistors N4 and N5, a detection unit 10 and a trigger unit 20, wherein details of the detection unit 10 and the trigger unit 20 are described above. An anode of the diode D3 is coupled to the I/O pad 60 and a cathode of the diode D3 is coupled to the power line VDD. Furthermore, the diode D3 can be any device type (p-n diode, MOS-connected diode and so on). The NMOS transistor N4 is coupled between the anode of the diode D3 and the NMOS transistor N5, which has a gate coupled to the resistors R1 and R2 and the PMOS transistor P2 for receiving the control signal CTRL1. The NMOS transistor N5 is coupled between the NMOS transistor N4 and the ground GND, which has a gate coupled to the resistor R4 and the PMOS transistors P1 and P2 for receiving the control signal CTRL2. The bulks of the NMOS transistors N4 and N5 are coupled to the ground GND.

In FIG. 3, the NMOS transistor N4 and N5 and the PMOS transistors P1 and P2 are low-voltage devices (e.g. 1.8V), and a higher fixed voltage (e.g. 3.3V) is applied to the power line VDD via a power pad of the IC. In normal mode, the control signal CTRL1 is determined according to a voltage division between the resistors R1 and R2, e.g. if R1=R2, CTRL1=VDD/2. Thus, the NMOS transistor N4 is turned on. Furthermore, the detection signal DET is determined according to the voltage of the power line VDD due to the diode D1 being off. Therefore, the PMOS transistors P1 and P2 are turned off, and then the control signal CTRL2 is pulled down to the ground GND via the resistor R4. Thus, the NMOS transistor N5 is turned off. When an ESD event occurs at the I/O pad 60, a portion of ESD energy from the I/O pad 60 passes through the diode D3 to the power line VDD. Therefore, the detection unit 10 provides the detection signal DET in response to the ESD event, to turn on the PMOS transistors P1 and P2. When the ESD event occurs at the I/O pad 60, a portion of ESD energy from the I/O pad 60 sequentially passes through the diode D3, the power line VDD and the PMOS transistor P1, to turn on the NMOS transistor N5, and then passes through the PMOS transistor P2 to turn on the NMOS transistor N4, as shown in label S3. Therefore, a discharge path is formed from the I/O pad 60 to the ground GND via the NMOS transistors N4 and N5 in an ESD mode, such that the electrical devices of the IC coupled to the power line VDD will be prevented from ESD damage. Similarly, a parasitic bipolar transistor and a parasitic resistor may further provide an additional discharge path for the ESD protection circuit 300.

Figure 4:
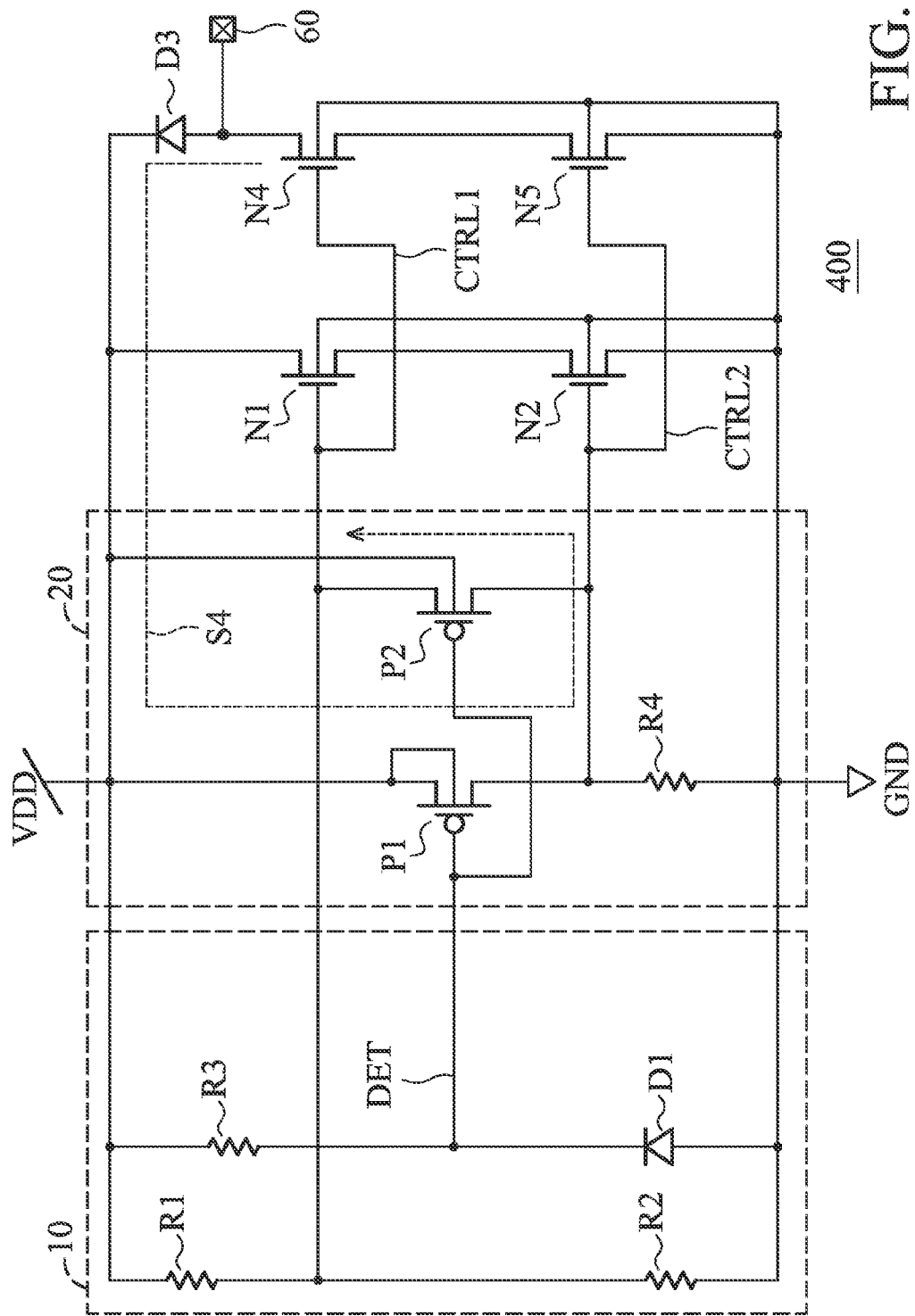
FIG. 4 shows an ESD protection circuit according to another embodiment of the invention.

FIG. 4 shows an ESD protection circuit 400 according to another embodiment of the invention, wherein the ESD protection circuit 400 is implemented in an IC. Compared to the ESD protection circuit 300 of FIG. 3, the ESD protection circuit 400 further comprises the NMOS transistors N1 and N2. The NMOS transistor N1 is coupled between the power line VDD and the NMOS transistor N2, which has a gate coupled to the gate of the NMOS transistor N4. The NMOS transistor N2 is coupled between the NMOS transistor N1 and the ground GND, which has a gate coupled to the gate of the NMOS transistor N5. In FIG. 4, the NMOS transistor N1, N2, N4 and N5 and the PMOS transistors P1 and P2 are low-voltage devices (e.g. 1.8V), and a higher fixed voltage (e.g. 3.3V) is applied to the power line VDD via a power pad of the IC. In normal mode, the control signal CTRL1 is determined according to a voltage division between the resistors R1 and R2, e.g. if R1=R2, CTRL1=VDD/2. Thus, the NMOS transistors N1 and N4 are turned on. Furthermore, the detection signal DET is determined according to the voltage of the power line VDD due to the diode D1 being off. Therefore, the PMOS transistors P1 and P2 are turned off, and then the control signal CTRL2 is pulled down to the ground GND via the resistor R4. Thus, the NMOS transistors N2 and N5 are turned off. When an ESD event occurs at the I/O pad 60, a portion of ESD energy from the I/O pad 60 passes through the diode D3 to the power line VDD. Therefore, the detection unit 10 provides the detection signal DET in response to the ESD event, to turn on the PMOS transistors P1 and P2. When the ESD event occurs at the I/O pad 60, a portion of ESD energy from the I/O pad 60 sequentially passes through the diode D3, the power line VDD and the PMOS transistor P1 to turn on the NMOS transistors N2 and N5, and then passes through the PMOS transistor P2 to turn on the NMOS transistors N1 and N4, as shown in label S4. In an ESD mode, a first discharge path is formed from the I/O pad 60 to the ground GND via the NMOS transistors N4 and N5, and a second discharge path is formed from the I/O pad 60 to the ground GND via the diode D3 and the NMOS transistors N4 and N5. Thus, the electrical devices of the IC coupled to the power line VDD will be prevented from ESD damage. Similarly, the parasitic bipolar transistors and the parasitic resistors may provide additional discharge paths for the ESD protection circuit 400.

Figure 5:
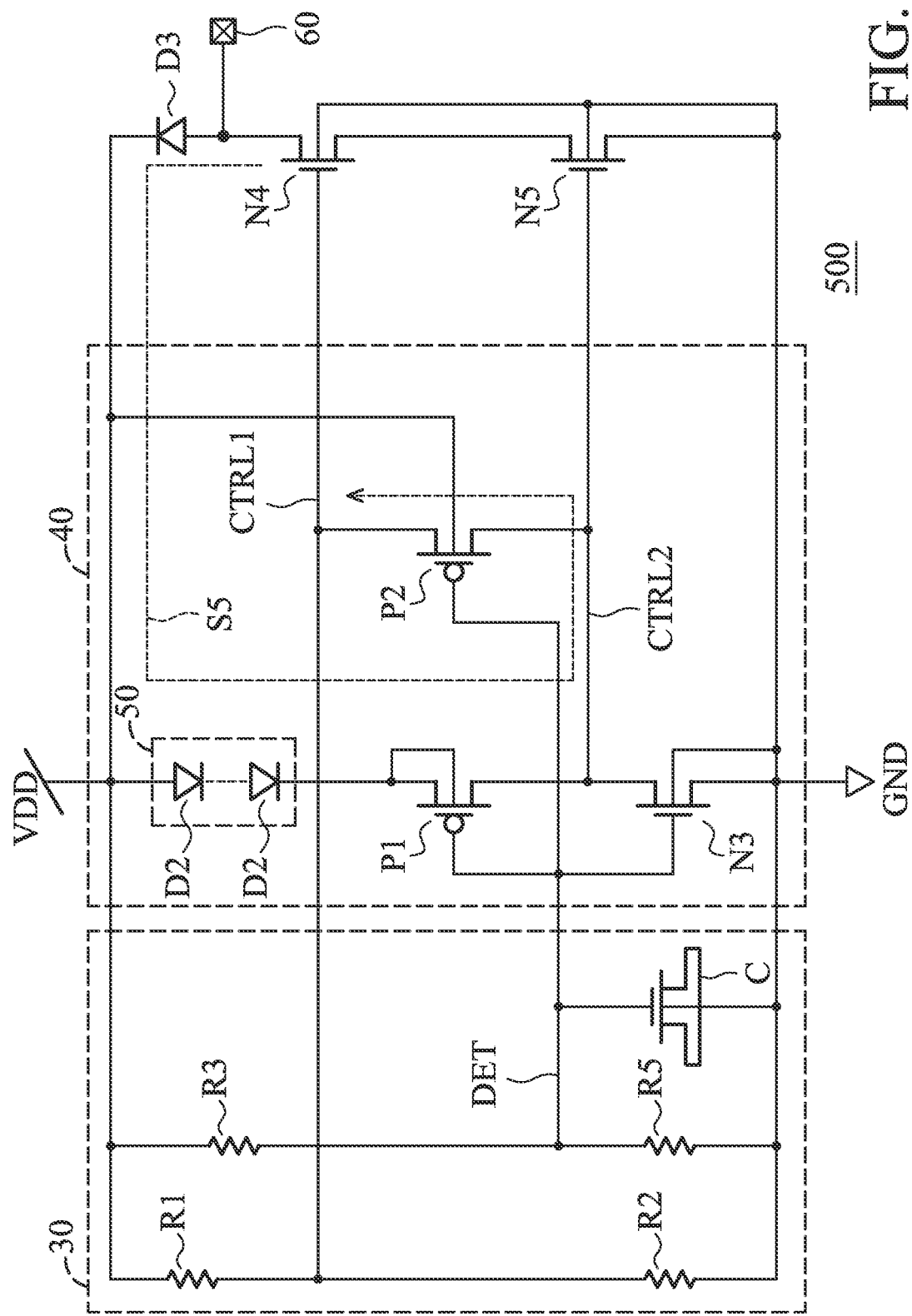
FIG. 5 shows an ESD protection circuit according to another embodiment of the invention.

FIG. 5 shows an ESD protection circuit 500 according to another embodiment of the invention, wherein the ESD protection circuit 500 is implemented in an IC. Compared to the ESD protection circuit 200 of FIG. 2, the ESD protection circuit 500 is used to provide ESD protection for an I/O pad 60 of the IC. The ESD protection circuit 500 comprises a diode D3, the NMOS transistors N4 and N5, a detection unit 30 and a trigger unit 40, wherein details of the detection unit 30 and the trigger unit 40 are described above. An anode of the diode D3 is coupled to the I/O pad 60 and a cathode of the diode D3 is coupled to the power line VDD. The NMOS transistor N4 is coupled between the anode of the diode D3 and the NMOS transistor N5, which has a gate coupled to the resistors R1 and R2 and the PMOS transistor P2 for receiving the control signal CTRL1. The NMOS transistor N5 is coupled between the NMOS transistor N4 and the ground GND, which has a gate coupled to the NMOS transistor N3 and the PMOS transistors P1 and P2 for receiving the control signal CTRL2.

In FIG. 5, the NMOS transistors N4 and N5 and the PMOS transistors P1 and P2 are low-voltage devices (e.g. 1.8V), and a higher fixed voltage (e.g. 3.3V) is applied to the power line VDD via a power pad of the IC. In normal mode, the control signal CTRL1 is determined according to a voltage division between the resistors R1 and R2, e.g. if R1=R2, CTRL1=VDD/2. Thus, the NMOS transistor N4 is turned on. Furthermore, the detection signal DET is determined according to a voltage division between the resistors R3 and R5, e.g. if R3=R5, DET=VDD/2. Therefore, the PMOS transistors P1 and P2 are turned off and the NMOS transistor N3 is turned on, and then the control signal CTRL2 is pulled down to the ground GND via the NMOS transistor N3. Thus, the NMOS transistor N5 is turned off. When an ESD event occurs at the I/O pad 60, a portion of ESD energy from the I/O pad 60 passes through the diode D3 to the power line VDD. Therefore, the detection unit 30 provides the detection signal DET in response to the ESD event, to turn on the PMOS transistors P1 and P2 and to turn off the NMOS transistor N3. When the ESD event occurs at the I/O pad 60, a portion of ESD energy the I/O pad 60 sequentially passes through the diode D3, the power line VDD, the diode chain 50 and the PMOS transistor P1, to turn on the NMOS transistor N5, and then passes through the PMOS transistor P2 to turn on the NMOS transistor N4, as shown in label S5. Therefore, a discharge path is formed from the I/O pad 60 to the ground GND via the NMOS transistors N4 and N5 in an ESD mode, such that the electrical devices of the IC coupled to the power line VDD will be prevented from ESD damage. Similarly, a parasitic bipolar transistor and a parasitic resistor may further provide an additional discharge path for the ESD protection circuit 500.

Figure 6:
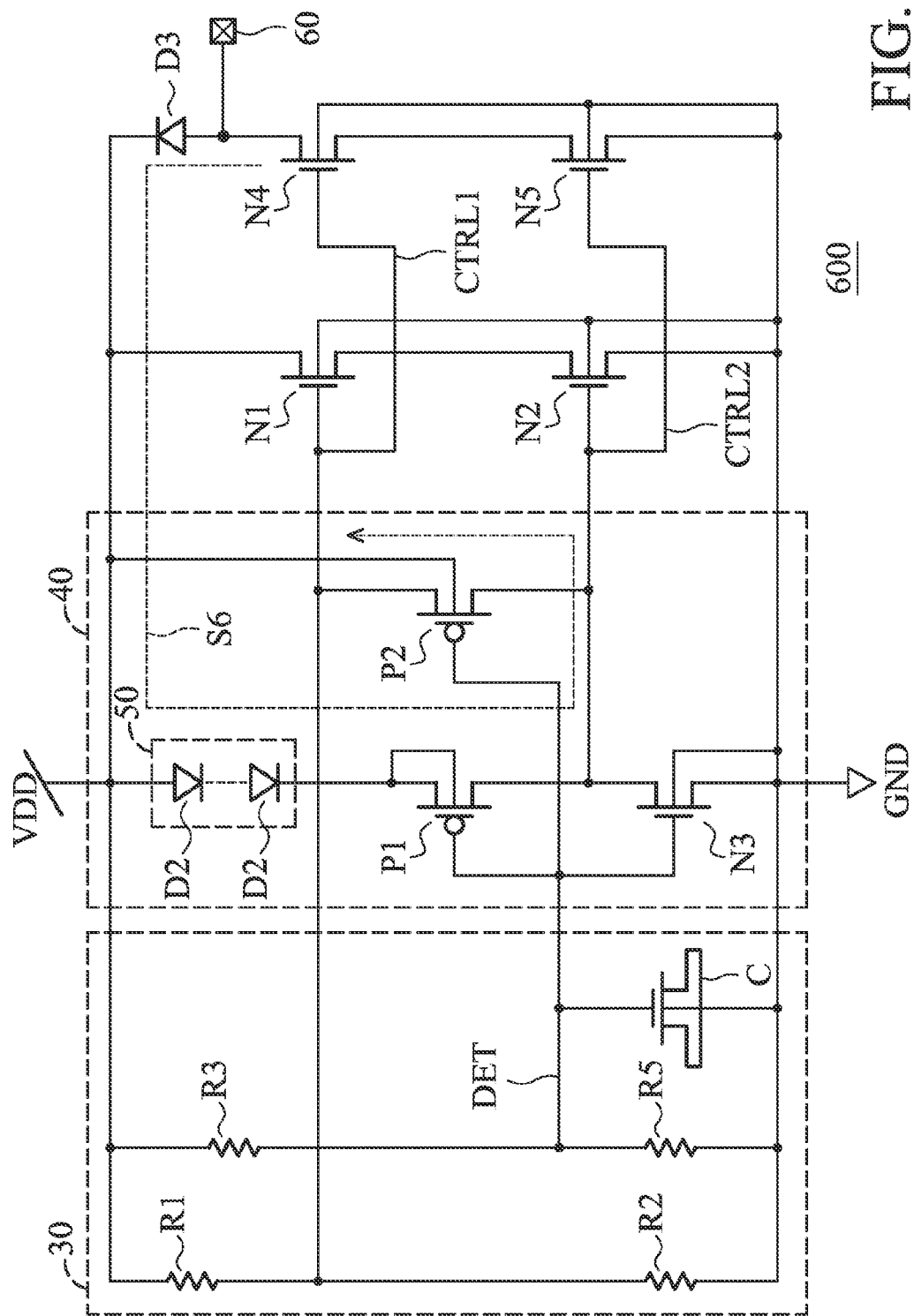
FIG. 6 shows an ESD protection circuit according to another embodiment of the invention.

FIG. 6 shows an ESD protection circuit 600 according to another embodiment of the invention, wherein the ESD protection circuit 600 is implemented in an IC. Compared to the ESD protection circuit 500 of FIG. 5, the ESD protection circuit 600 further comprises the NMOS transistors N1 and N2. The NMOS transistor N1 is coupled between the power line VDD and the NMOS transistor N2, which has a gate coupled to the gate of the NMOS transistor N4. The NMOS transistor N2 is coupled between the NMOS transistor N1 and the ground GND, which has a gate coupled to the gate of the NMOS transistor N5. In FIG. 6, the NMOS transistors N1, N2, N4 and N5 and the PMOS transistors P1 and P2 are low-voltage devices (e.g. 1.8V), and a higher fixed voltage (e.g. 3.3V) is applied to the power line VDD via a power pad of the IC. In normal mode, the control signal CTRL1 is determined according to a voltage division between the resistors R1 and R2, e.g. if R1=R2, CTRL1=VDD/2. Thus, the NMOS transistors N1 and N4 are turned on. Furthermore, the detection signal DET is determined according to a voltage division between the resistors R3 and R5, e.g. if R3=R5, DET=VDD/2. Therefore, the PMOS transistors P1 and P2 are turned off and the NMOS transistor N3 is turned on, and then the control signal CTRL2 is pulled down to the ground GND via the NMOS transistor N3. Thus, the NMOS transistors N2 and N5 are turned off. When an ESD event occurs at the I/O pad 60, a portion of ESD energy from the I/O pad 60 passes through the diode D3 to the power line VDD. Therefore, the detection unit 30 provides the detection signal DET in response to the ESD event, to turn on the PMOS transistors P1 and P2 and to turn off the NMOS transistor N3. When the ESD event occurs at the I/O pad 60, a portion of ESD energy from the I/O pad 60 sequentially passes through the diode D3, the power line VDD, the diode chain 50 and the PMOS transistor P1, to turn on the NMOS transistors N2 and N5, and then passes through the PMOS transistor P2 to turn on the NMOS transistors N1 and N4, as shown in label S6. In ESD mode, a first discharge path is formed from the I/O pad 60 to the ground GND via the NMOS transistors N4 and N5, and a second discharge path is formed from the I/O pad 60 to the ground GND via the diode D3 and the NMOS transistors N4 and N5. Thus, the electrical devices of the IC coupled to the power line VDD will be prevented from ESD damage. Similarly, the parasitic bipolar transistors and the parasitic resistors may provide additional discharge paths for the ESD protection circuit 600.

While the invention has been described by way of example and in terms of the preferred embodiments, it is to be understood that the invention is not limited to the disclosed embodiments. On the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. An electrostatic discharge (ESD) protection circuit, comprising:
    a first NMOS transistor coupled to a power line;
    a second NMOS transistor coupled between the first transistor and a ground;
    a detection unit, providing a detection signal when an ESD event occurs at the power line; and
    a trigger unit, turning on the second NMOS transistor and the first NMOS transistor in sequence in response to the detection signal, such that a discharge path is formed from the power line to the ground via the first and second NMOS transistors, wherein the trigger unit further comprises:
    a first PMOS transistor coupled between the power line and a gate of the second NMOS transistor, having a gate coupled to the cathode of the diode for receiving the detection signal;
    a fourth resistor coupled between the gate of the second NMOS transistor and the ground; and
    a second PMOS transistor coupled between the gates of the first and second NMOS transistors, having a gate coupled to the cathode of the diode for receiving the detection signal.

2. The ESD protection circuit as claimed in claim 1, wherein the detection unit comprises:
    a first resistor coupled between the power line and a gate of the first NMOS transistor;
    a second resistor coupled between the gate of the first NMOS transistor and the ground;
    a third resistor coupled to the power line; and
    a diode, having an anode coupled to the ground and a cathode coupled to the third resistor.

3. The ESD protection circuit as claimed in claim 2, wherein the first and second PMOS transistors are turned off by the detection signal when the ESD event is absent, wherein the first NMOS transistor is turned on by a voltage division between the first and second resistors and the second NMOS transistor is turned off by the fourth resistor when the ESD event is absent.

4. The ESD protection circuit as claimed in claim 3, wherein when the ESD event occurs, the first and second PMOS transistors are turned on by the detection signal, wherein the second NMOS transistor is turned on by an ESD energy from the power line through the first PMOS transistor, and the second NMOS transistor is turned on by an ESD energy from the power line through the first PMOS transistor and the second PMOS transistor.

5. The ESD protection circuit as claim in claim 1, further comprising:
    a parasitic bipolar transistor and a parasitic resistor, coupled between the power line and the ground, wherein the parasitic bipolar transistor and the parasitic resistor provide an additional discharge path for the ESD protection circuit 200.

6. An ESD protection circuit, comprising:
    a first NMOS transistor coupled to a power line;
    a second NMOS transistor coupled between the first transistor and a ground;
    a detection unit, providing a detection signal when an ESD event occurs at the power line; and
    a trigger unit, turning on the second NMOS transistor and the first NMOS transistor in sequence in response to the detection signal, such that a discharge path is formed from the power line to the ground via the first and second NMOS transistors,
    wherein the trigger unit comprises:
    a first PMOS transistor coupled between the power line and a gate of the second NMOS transistor, having a gate coupled to the capacitor for receiving the detection signal;
    a third NMOS transistor coupled between the ground and the gate of the second NMOS transistor, having a gate coupled to the capacitor for receiving the detection signal;
    at least a diode coupled in a forward conduction direction from the power line to the first PMOS transistor; and
    a second PMOS transistor coupled between the gates of the first and second NMOS transistors, having a gate coupled to the capacitor for receiving the detection signal.

7. The ESD protection circuit as claimed in claim 6, wherein the detection unit comprises:
    a first resistor coupled between the power line and a gate of the first NMOS transistor;
    a second resistor coupled between the gate of the first NMOS transistor and the ground;
    a third resistor coupled to the power line;
    a fourth resistor coupled between the third resistor and the ground; and
    a capacitor coupled to the fourth resistor in parallel.

8. The ESD protection circuit as claimed in claim 6, wherein the first and second PMOS transistors are turned off by the detection signal when the ESD event is absent, wherein the first NMOS transistor is turned on by a voltage division between the first and second resistors and the second NMOS transistor is turned off by the third NMOS transistor when the ESD event is absent.

9. The ESD protection circuit as claimed in claim 6, wherein when the ESD event occurs, the first and second PMOS transistors are turned on by the detection signal, wherein the second NMOS transistor is turned on by ESD energy from the power line through the first PMOS transistor, and the second NMOS transistor is turned on by ESD energy from the power line through the first PMOS transistor and the second PMOS transistor.

10. The ESD protection circuit as claimed in claim 6, further comprising:
    a first diode, having an anode coupled to a pad and a cathode coupled to a power line.

11. The ESD protection circuit as claimed in claim 6, further comprising:
    a third NMOS transistor coupled to the power line, having a gate coupled to the gate of the first NMOS transistor; and a fourth NMOS transistor coupled between the third NMOS transistor and the ground, having a gate coupled to the gate of the second NMOS transistor, wherein the fourth NMOS transistor and the third NMOS transistor are turned on in sequence in response to the detection signal, such that a second discharge path is formed from the pad to the ground through the first diode and the third and fourth NMOS transistors.

12. The ESD protection circuit as claimed in claim 6, wherein when the ESD event occurs, the first and second PMOS transistors are turned on by the detection signal, wherein the second NMOS transistor is turned on by ESD energy from the pad sequentially through the first diode, the power line and the first PMOS transistor, and the second NMOS transistor is turned on by ESD energy from the pad sequentially through the first diode, the power line, the first PMOS transistor and the second PMOS transistor.

* * * * *